United States Patent
Shimodaira

(10) Patent No.: US 9,918,378 B1
(45) Date of Patent: Mar. 13, 2018

(54) WIRING SUBSTRATE

(71) Applicant: SHINKO ELECTRIC INDUSTRIES CO., LTD., Nagano (JP)

(72) Inventor: Tomoyuki Shimodaira, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/784,296

(22) Filed: Oct. 16, 2017

(30) Foreign Application Priority Data

Nov. 18, 2016 (JP) ................................ 2016-225475

(51) Int. Cl.
  *H05K 1/02* (2006.01)
  *H01L 23/498* (2006.01)
  *H05K 1/09* (2006.01)
  *H01L 21/48* (2006.01)

(52) U.S. Cl.
  CPC ....... *H05K 1/0213* (2013.01); *H01L 21/4853* (2013.01); *H01L 23/49811* (2013.01); *H01L 23/49838* (2013.01); *H01L 23/49866* (2013.01); *H05K 1/09* (2013.01)

(58) Field of Classification Search
  CPC .. H05K 1/0213; H05K 1/0242; H05K 1/0296; H05K 1/11; H05K 1/111
  See application file for complete search history.

(56) References Cited

U.S. PATENT DOCUMENTS

2005/0167830 A1   8/2005   Chang et al.

FOREIGN PATENT DOCUMENTS

JP   2005-217388   8/2005

*Primary Examiner* — Jeremy C Norris
(74) *Attorney, Agent, or Firm* — IPUSA, PLLC

(57) ABSTRACT

A wiring substrate includes a wiring layer, an insulating layer covering the wiring layer, and a protruding electrode including a protruding metal layer and a surface metal layer. The protruding metal layer is connected to the wiring layer in an opening of the insulating layer, extends from within the opening to be stepped at the edge of the opening to extend outward onto the insulating layer, and includes a first surface contacting a surface of the insulating layer around the opening, a second surface, and a peripheral surface extending between the first and second surfaces, and bent inward to form a space between the peripheral surface and the surface of the insulating layer. The surface metal layer covers the protruding metal layer without contacting the surface of the insulating layer, and is formed of a metal having a lower melting point than the protruding metal layer.

8 Claims, 13 Drawing Sheets

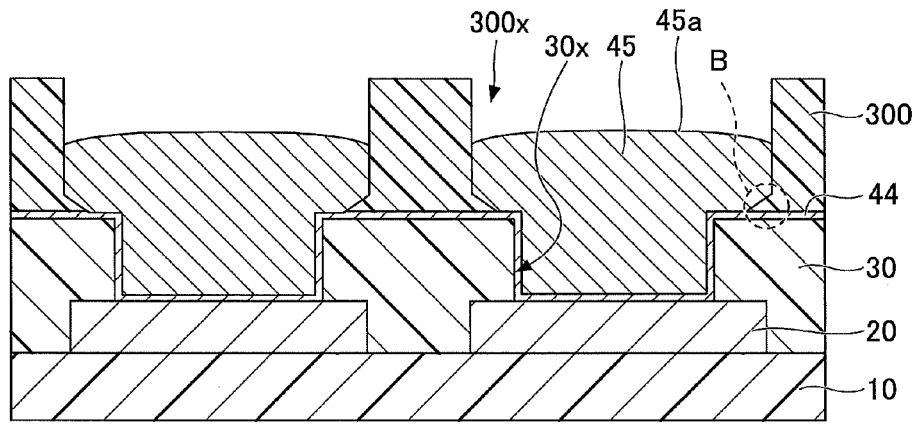
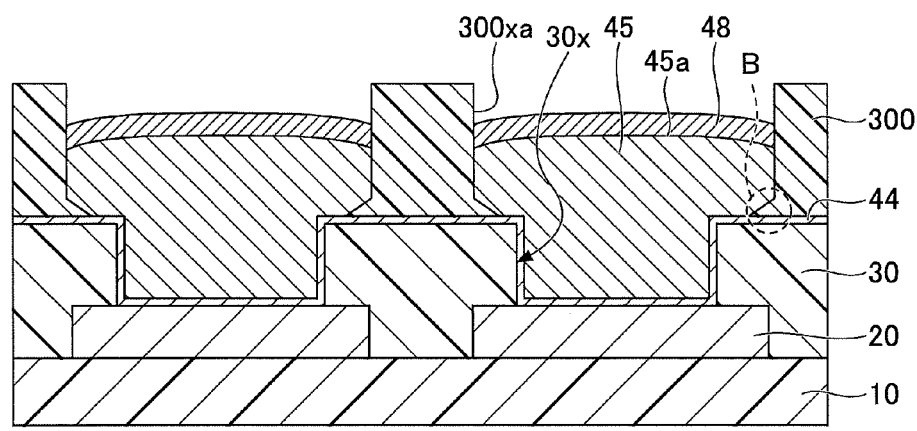
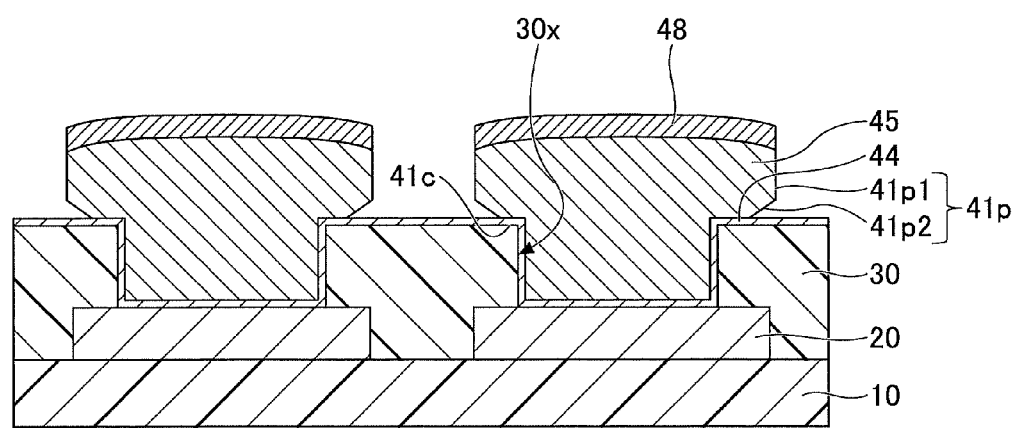

WIRING SUBSTRATE

CROSS-REFERENCE TO RELATED APPLICATION

This application is based upon and claims the benefit of priority of the prior Japanese Patent Application No. 2016-225475, filed on Nov. 18, 2016, the entire contents of which are incorporated herein by reference.

FIELD

A certain aspect of the embodiments discussed herein is related to wiring substrates.

BACKGROUND

For wiring substrates on which semiconductor chips or the like are mountable, there is a demand for fine-pitch electrodes to be connected to semiconductor chips or the like. For example, protruding electrodes formed mainly of tin (Sn) have been studied.

For example, a protruding electrode formed by forming a surface metal layer of a solder material on a conductive pillar protruding from an upper surface of an insulating layer by electroplating and thereafter melting the surface metal layer by a reflow process to cover the entire surface of the conductive pillar exposed on the upper surface of the insulating layer with the surface metal layer is proposed. (See, for example, Japanese Laid-open Patent Publication No. 2005-217388).

SUMMARY

According to an aspect of the present invention, a wiring substrate includes a wiring layer, an insulating layer covering the wiring layer, and a protruding electrode including a protruding metal layer and a surface metal layer. The protruding metal layer is connected to the wiring layer in an opening of the insulating layer, extends from within the opening to be stepped at the edge of the opening to extend outward onto the insulating layer, and includes a first surface contacting a surface of the insulating layer around the opening, a second surface, and a peripheral surface extending between the first and second surfaces, and bent inward to form a space between the peripheral surface and the surface of the insulating layer. The surface metal layer covers the protruding metal layer without contacting the surface of the insulating layer, and is formed of a metal having a lower melting point than the protruding metal layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 3A through 3H are diagrams illustrating a process of manufacturing a wiring substrate according to the first embodiment;

DESCRIPTION OF EMBODIMENTS

Figure 1A:
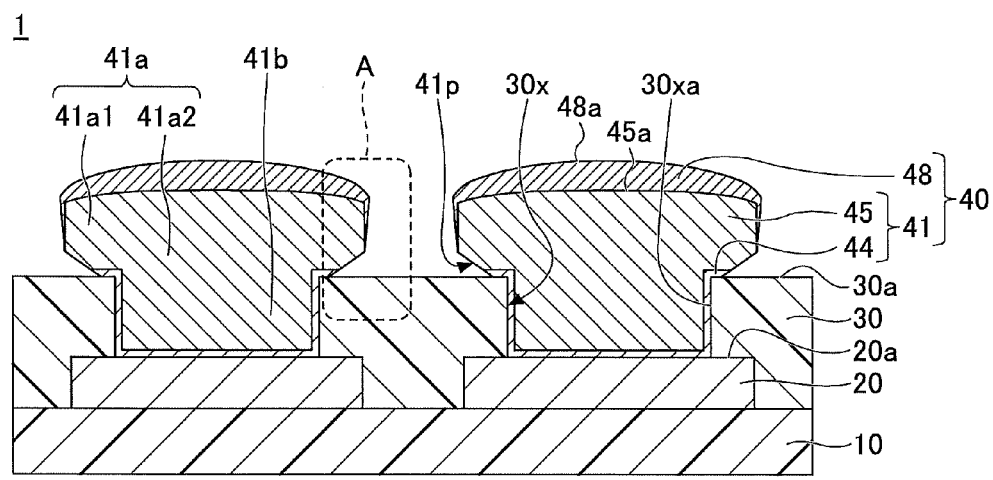
FIGS. 1A and 1B are cross-sectional views of a wiring substrate according to a first embodiment.

According to the structure of the above-described protruding electrode, however, the surface metal layer contacts the insulating layer. Therefore, when performing a reflow process, the surface metal layer flows onto the upper surface of the insulating layer to bridge and short-circuit adjacent protruding electrodes with the material of the surface metal layer. This becomes an issue particularly in the case of providing fine-pitch protruding electrodes.

According to an aspect of the present invention, a wiring substrate in which adjacent protruding electrodes are less likely to be bridged and short-circuited by the heating and melting of a surface metal layer is provided.

Preferred embodiments of the present invention will be explained with reference to accompanying drawings. In the following description, the same elements or components are referred to using the same reference numeral, and duplicate description thereof may be omitted.

First Embodiment

[Structure of Wiring Substrate]

Figure 1B:
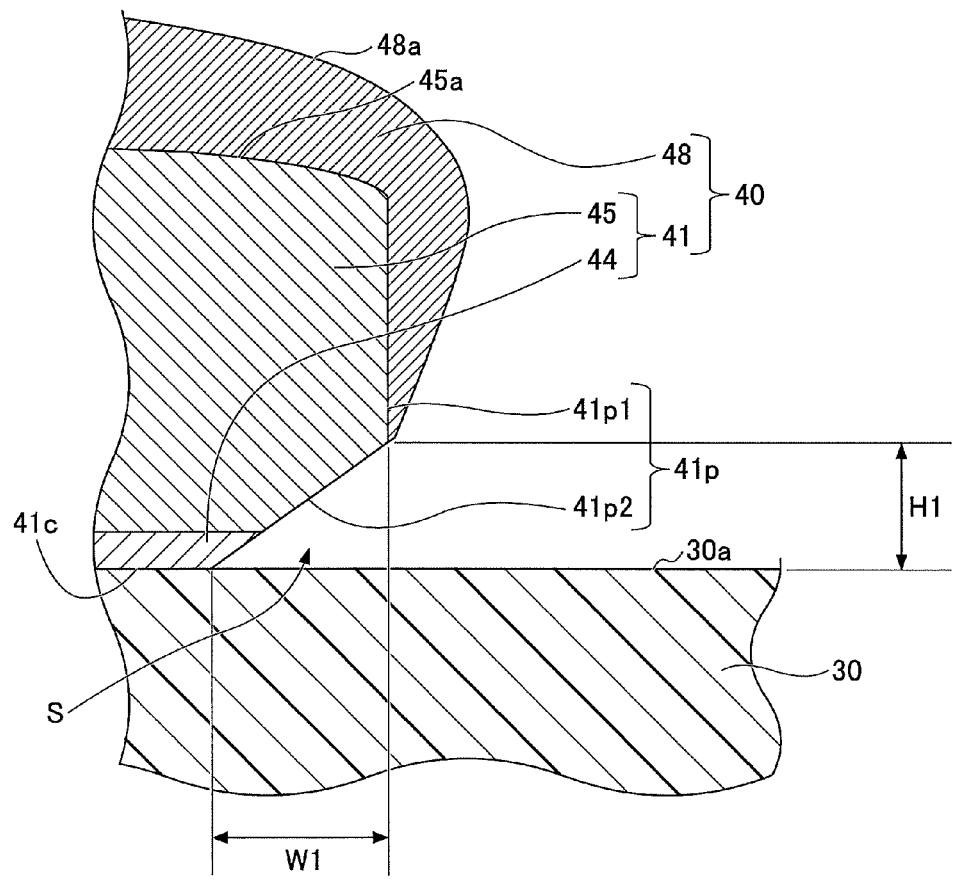
Figure 2A:
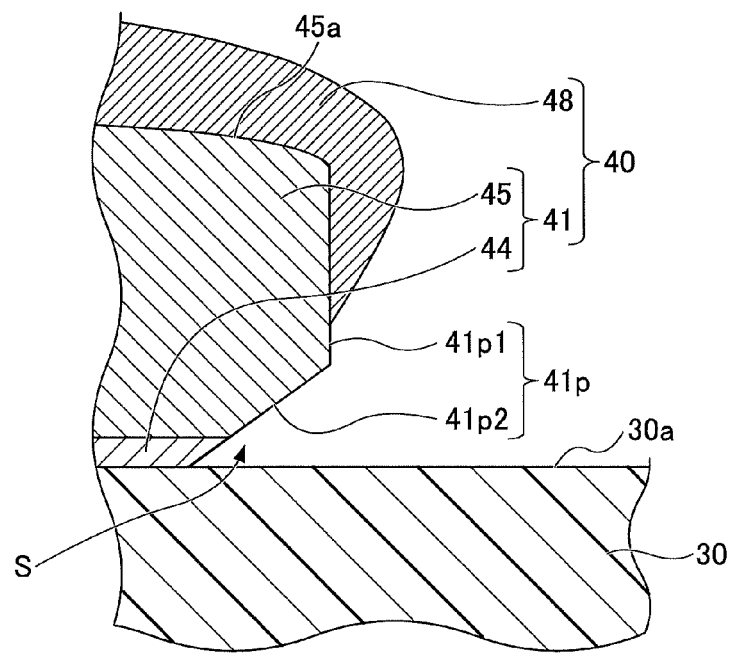
FIGS. 2A and 2B are enlarged cross-sectional views of part of the wiring substrate, illustrating the coverage position of a surface metal layer.

FIGS. 1A and 1B are cross-sectional views of a wiring substrate according to a first embodiment. FIG. 1A is a cross-sectional view of part of the wiring substrate, where wiring layers and insulating layers are alternately stacked. FIG. 2A is an enlarged view of part A of FIG. 1A.

Referring to FIGS. 1A and 1B, a wiring substrate 1 includes an insulating layer 10, a wiring layer 20, a solder resist layer 30, and bumps 40. In the following description, the bumps 40 may be collectively referred to as "bump 40" where a description is common to the bumps 40.

According to this embodiment, for convenience of description, the direction from the insulating layer 10 to the solder resist layer 30 is referred to as an upward direction, and the direction opposite to the upward direction is referred to as a downward direction. Furthermore, with respect to each part or element of the wiring substrate 1, a surface facing in the upward direction will be referred to as "upper surface" or "first surface," and a surface facing in the downward direction will be referred to as "lower surface" or "second surface." The wiring substrate 1, however, may be used in an inverted position or oriented at any angle. Furthermore, a plan view refers to a view of an object taken in a direction normal to the first or second surface of the insulating layer 10, and a planar shape refers to the shape of an object viewed in a direction normal to the first or second surface of the insulating layer 10.

The insulating layer 10 is, for example, an insulating layer that may be formed as an interlayer insulating layer in multilayer wiring using a build-up process. Accordingly, other wiring layers and insulating layers may be stacked as underlayers of the insulating layer 10. In this case, via holes may be suitably provided in the insulating layer 10 and other insulating layers to connect wiring layers through the via holes.

Suitable materials for the insulating layer 10 include, for example, a non-photosensitive (thermosetting) epoxy insulating resin, a non-photosensitive (thermosetting) polyimide insulating resin, a photosensitive epoxy insulating resin, and a photosensitive acrylic insulating resin. The insulating layer 10 may include a reinforcing member such as glass cloth. Furthermore, the insulating layer 10 may include a filler such as silica ($SiO_2$). The thickness of the insulating layer 10 may be, for example, approximately 10 μm to approximately 50 μm.

The wiring layer 20 is formed on the insulating layer 10. Suitable materials for the wiring layer 20 include, for example, copper (Cu). The thickness of the wiring layer 20 may be, for example, approximately 10 μm to approximately 20 μm.

The solder resist layer 30 is an insulating layer formed on the insulating layer 10 to cover the wiring layer 20. The solder resist layer 30 includes openings 30x (hereinafter collectively referred to as "opening 30" where a description is common to the openings 30x). An upper surface 20a of the wiring layer 20 is partly exposed at the bottom of the opening 30x. Suitable materials for the solder resist layer 30 include, for example, a photosensitive epoxy insulating resin and a photosensitive acrylic insulating resin. The thickness of the solder resist layer 30 may be, for example, approximately 5 μm to approximately 40 μm.

The bump 40 is a protruding electrode protruding from an upper surface 30a of the solder resist layer 30. The bump 40 is electrically connectable to a semiconductor chip or the like. The bump 40 includes a protruding metal layer 41 and a surface metal layer 48. The protruding metal layer 41 is connected to the wiring layer 20 exposed in the opening 30x formed in the solder resist layer 30. The protruding metal layer 41 protrudes from the upper surface 30a of the solder resist layer 30 and extends onto the upper surface 30a around the opening 30x. Thus, the protruding metal layer 41 extends from within the opening 30x to be stepped at the edge of the opening 30x to extend outward onto the upper surface 30a of the solder resist layer 30. A surface of the protruding metal layer 41 that contacts the upper surface 30a of the solder resist layer 30 around the opening 30x is referred to as "step surface 41c."

The protruding metal layer 41 includes a first metal layer 44 and a second metal layer 45. The first metal layer 44 continuously covers the upper surface 30a of the solder resist layer 30 around the opening 30x, an inner wall surface 30xa of the opening 30x, and the upper surface 20a of the wiring layer 20 exposed in the opening 30x. The second metal layer 45 is formed on the first metal layer 44 to protrude from the upper surface 30a of the solder resist layer 30. An upper surface 45a of the second metal layer 45 may be, for example, convexly curved. The upper surface 45a of the second metal layer 45 forms the upper surface (top surface) of the protruding metal layer 41.

The first metal layer 44 may be formed of, for example, copper (Cu). The thickness of the first metal layer 44 may be, for example, approximately 0.5 μm. The second metal layer 45 may be formed of a metal harder than the surface metal layer 48, such as copper (Cu), nickel (Ni), or gold (Au). The vertical distance between a plane including the upper surface 30a of the solder resist layer 30 and the upper surface 45a of the second metal layer 45 where the second metal layer 45 is thickest may be, for example, approximately 10 μm to approximately 50 μm.

Referring to FIGS. 1A and 1B, the protruding metal layer 41 includes the upper surface (the upper surface 45a), the step surface 41c, and a peripheral surface (side surface) 41p extending between the upper surface and the step surface 41c. The peripheral surface 41p is bent inward to have a first peripheral surface 41p1 and a second peripheral surface 41p2 angled relative to the first peripheral surface 41p1. The first peripheral surface 41p1 is substantially perpendicular to the upper surface 30a of the solder resist layer 30.

Thus, on a part of the protruding metal layer 41 facing (immediately above) the upper surface 30a of the solder resist layer 30, the second peripheral surface 41p2 is formed to extend inward from the first peripheral surface 41p1 of the protruding metal layer 41 at an acute angle relative to the upper surface 30a. To be more specific, on an exposed part 41a of the protruding metal layer 41 exposed on and extending over the upper surface 30a of the solder resist layer 30, the second peripheral surface 41p2 is formed to extend inward from the first peripheral surface 41p1 to the step surface 41c (the bottom of the exposed part 41a) to form a space S between the second peripheral surface 41p2 and the upper surface 30a of the solder resist layer 30. In other words, a bottom peripheral portion of the exposed part 41a of the protruding metal layer 41 is perimetrically sloped at an acute angle relative to the upper surface 30a of the solder resist layer 30. The shape of the second peripheral surface 41p2 may correspond to the shape of the below-described skirt shape.

Thus, the exposed part 41a includes a lower portion 41a2 that narrows toward the bottom of the exposed part 41a contacting the upper surface 30a of the solder resist layer 30. In other words, the protruding metal layer 41 includes a buried part 41b buried in the solder resist layer 30 and the exposed part 41a exposed on the upper surface 30a of the solder resist layer 30 and extending from the buried part 41b onto the upper surface 30a of the solder resist layer 30 around the opening 30x. The buried part 41b and the exposed part 41a are formed together as one piece. The exposed part 41a includes an upper portion 41a1 including the upper surface 45a of the second metal layer 45 and the lower portion 41a2 extending between the upper portion 41a1 and the buried part 41b. The lower portion 41a2 narrows toward the bottom of the exposed part 41a. That is, the lower portion 41a2 extends from the buried part 41b to expand outward toward the upper portion 41a1 (in the upward direction) to have a peripheral surface (the second peripheral surface 41p2) inclined relative to the upper surface 30a of the solder resist layer 30.

The space S defined by the second peripheral surface 41p2 and the upper surface 30a of the solder resist layer 30 gradually increases in height (vertical size) in an outward direction away from the opening 30x. A maximum height H1 of the space S from the upper surface 30a of the solder resist layer 30, namely, the vertical distance from the upper surface 30a to the highest point of the second peripheral surface 41p2 farthest from the upper surface 30a in a direction perpendicular to the upper surface 30a, is approximately five times to approximately ten times the thickness of the first metal layer 44, and may be, for example, approximately 3 μm to approximately 5 μm. A width W1 of the space S in a direction parallel to the upper surface 30a of the solder resist layer 30 may be, for example, approximately 4 μm to approximately 6 μm.

The surface metal layer 48 covers a surface of the protruding metal layer 41. The surface metal layer 48, however, does not contact the upper surface 30a of the solder resist layer 30. The surface metal layer 48 may be formed to, for example, cover the entirety of the upper surface (the upper surface 45a of the second metal layer 45) and the entirety of the first peripheral surface 41p1 of the protruding metal layer 41 without extending onto the second peripheral surface 41p2 as illustrated in FIGS. 1A and 1B.

Figure 2B:
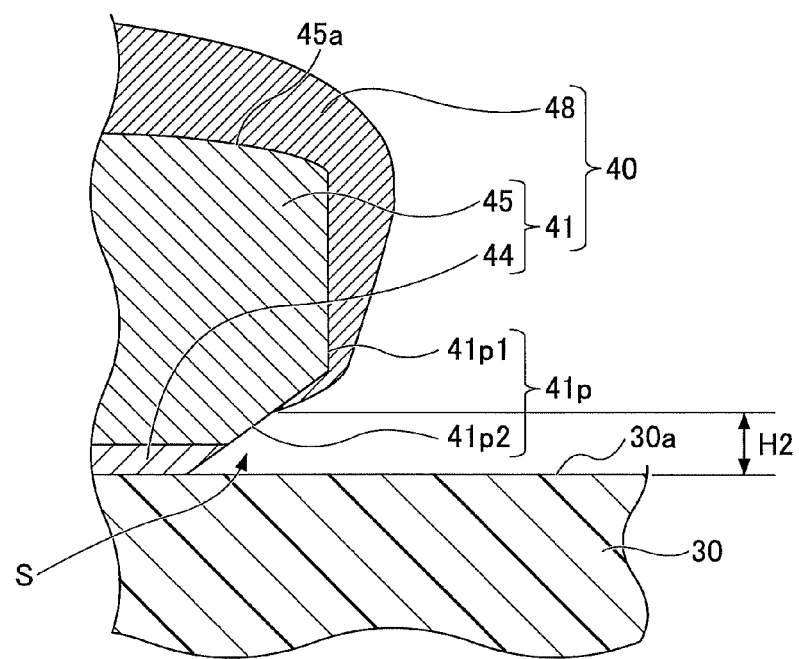

Alternatively, for example, as illustrated in FIG. 2A, the surface metal layer 48 may be formed to cover the entirety of the upper surface and part of the first peripheral surface 41p1 of the protruding metal layer 41 without extending onto the second peripheral surface 41p2. As yet another alternative, for example, as illustrated in FIG. 2B, the surface metal layer 48 may be formed to cover the entirety of the upper surface, the entirety of the first peripheral surface 41p1, and part of the second peripheral surface 41p2 of the protruding metal layer 41 without contacting the upper surface 30a of the solder resist layer 30. In the case of FIG. 2B, a height H2, which is the distance between the upper surface 30a of the solder resist layer 30 and the lowest point (end) of the surface metal layer 48, is preferably 2 μm or more.

An upper surface 48a of the surface metal layer 48 may be, for example, convexly curved. The curvature of the upper surface 48a of the surface metal layer 48 may be greater than the curvature of the upper surface 45a of the second metal layer 45. The thickness of the surface metal layer 48 may decrease from the center to the periphery. The thickness of the thickest part of the surface metal layer 48 may be, for example, approximately 15 μm to approximately 20 μm.

The surface metal layer 48 is formed of a metal having a lower melting point than the protruding metal layer 41. When the protruding metal layer 41 is formed of copper (Cu), nickel (Ni), or gold (Au), the surface metal layer 48 may be formed of, for example, tin (Sn), a Sn—Zn metal, a Sn—Ag—Cu metal, or a Sn—Cu metal.

[Method of Manufacturing Wiring Substrate]

Next, a method of manufacturing a wiring substrate according to the first embodiment is described. FIGS. 3A through 3H are diagrams illustrating a process of manufacturing a wiring substrate according to the first embodiment. According to the process illustrated below, a single wiring substrate is manufactured. The process, however, may be adapted to manufacture a structure to become multiple wiring substrates and thereafter divide the structure into individual wiring substrates.

Figure 3A:
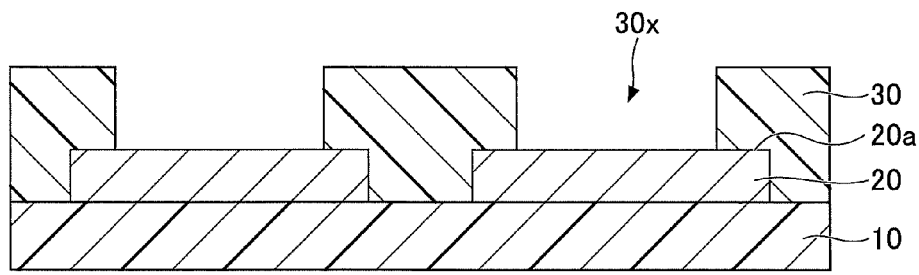

First, in the process depicted in FIG. 3A, the insulating layer 10 is prepared, and the wiring layer 20 is formed on the upper surface of the insulating layer 10 by a known process such as sputtering or plating. Thereafter, the solder resist layer 30 is formed on the insulating layer 10 to cover the wiring layer 20, and the opening 30x is famed in the solder resist layer 30 to selectively expose the upper surface 20a of the wiring layer 20. For example, a resin in liquid or paste form is employed as the material of the solder resist layer 30. The resin in liquid or paste form is applied onto the insulating layer 10 by, for example, spin coating to cover the wiring layer 20, and is cured. Then, the solder resist layer 30 is exposed to light and developed to form the opening 30x at a predetermined position.

Next, in the process depicted in FIGS. 3B through 3H, the bump 40 is formed by, for example, a semi-additive process. First, in the process depicted in FIG. 3B, the first metal layer 44 is formed to continuously cover the upper surface 30a of the solder resist layer 30, the inner wall surface 30xa of the opening 30x, and the upper surface 20a of the wiring layer 20 exposed in the opening 30x. The first metal layer 44, which serves as a seed layer, may be formed by, for example, electroless plating. The material and thickness of the first metal layer 44 are as described above.

Figure 3B:
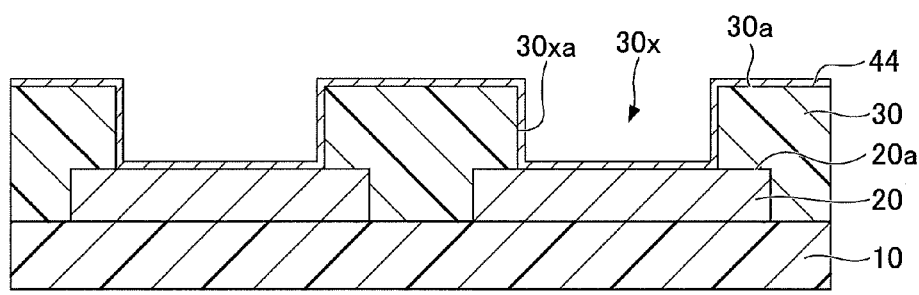
Figure 3C:
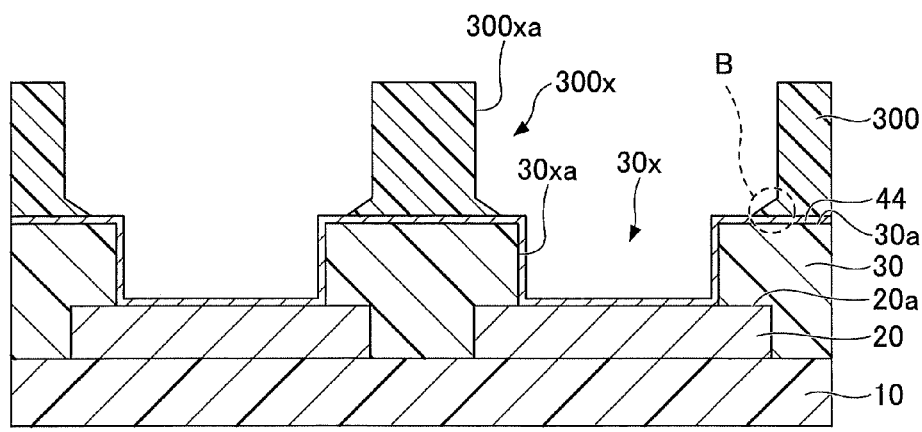

Next, in the process depicted in FIG. 3C, a negative photosensitive resist (such as a dry film resist) is formed on the first metal layer 44. Then, the photosensitive resist is exposed to light and developed to form a resist layer 300 that includes openings 300x (hereinafter collectively referred to as "opening 300x") that expose the first metal layer 44 on and around the opening 30x. According to this embodiment, the resist layer 300 has a skirt shape (indicated by B in FIG. 3C) at the bottom of the opening 300x so that an inner wall surface 300xa of the opening 300x is bent inward at its bottom. Here, the skirt shape refers to a shape whose cross section has a substantially triangular shape whose thickness decreases from the inner wall surface 300xa to the center of the opening 300x. The inclined surface of the skirt shape, however, does not have to be a flat surface, and a part or the entirety of the inclined surface may be convexly curved or concavely curved.

The skirt shape may be formed by causing the amount of exposure to light to be less than normally is when exposing the photosensitive resist to, for example, ultraviolet radiation. For example, when the photosensitive resist formed on the first metal layer 44 is 25 μm in thickness and the openings 300x are to be formed at intervals of 90 μm, the skirt shape can be formed during the development of the photosensitive resist by exposing the photosensitive resist to light with an output of approximately 120 mJ.

When the photosensitive resist formed on the first metal layer 44 is 25 μm in thickness and the openings 300x are to be formed at intervals of 90 μm, exposure is normally performed with an output of approximately 150 mJ. In this case, no skirt shape is formed, and the opening 300x is formed with a substantially perpendicular inner wall surface.

Next, in the process depicted in FIG. 3D, the second metal layer 45 is formed in the opening 300x of the resist layer 300 by electroplating, using the first metal layer 44 as a power feed layer. The material and thickness of the second metal layer 45 are as described above. At this point, it is preferable to convexly curve the upper surface 45a of the second metal layer 45 by adjusting electroplating conditions. This is because when the surface metal layer 48 formed on the upper surface 45a of the second metal layer 45 is melted in a subsequent process, the wet surface metal layer 48 easily spreads from the upper surface 45a onto a peripheral surface of the second metal layer 45.

Next, in the process depicted in FIG. 3E, the surface metal layer 48 is formed on the upper surface 45a of the second metal layer 45 exposed in the opening 300x of the resist layer 300 by electroplating, using the first metal layer 44 as a power feed layer. The material of the surface metal layer 48 is as described above. At this point, the surface metal layer 48 has a substantially constant thickness on the second metal layer 45.

Next, in the process depicted in FIG. 3F, the resist layer 300 is removed using a stripping solution. Then, in the process depicted in FIG. 3G, part of the first metal layer 44 not covered with the second metal layer 45 is removed by etching, using the second metal layer 45 and the surface metal layer 48 as a mask. As a result, the protruding metal layer 41 including the first metal layer 44 and the second metal layer 45 stacked on the first metal layer 44 is formed.

On a part of the protruding metal layer 41 facing (immediately above) the upper surface 30a of the solder resist layer 30, the second peripheral surface 41p2 is formed to extend inward from the first peripheral surface 41p1 of the protruding metal layer 41 at an acute angle relative to the upper surface 30a. To be more specific, on the exposed part 41a of the protruding metal layer 41 exposed on and extending over the upper surface 30a of the solder resist layer 30, the second peripheral surface 41p2 is formed to extend inward from the first peripheral surface 41p1 to the step surface 41c (the bottom of the exposed part 41a) to form the space S between the second peripheral surface 41p2 and the upper surface 30a of the solder resist layer 30. The height of the space S defined by the second peripheral surface 41p2 and the upper surface 30a gradually increases from the opening 30x toward the peripheral side of the protruding metal layer 41.

Figure 3G:
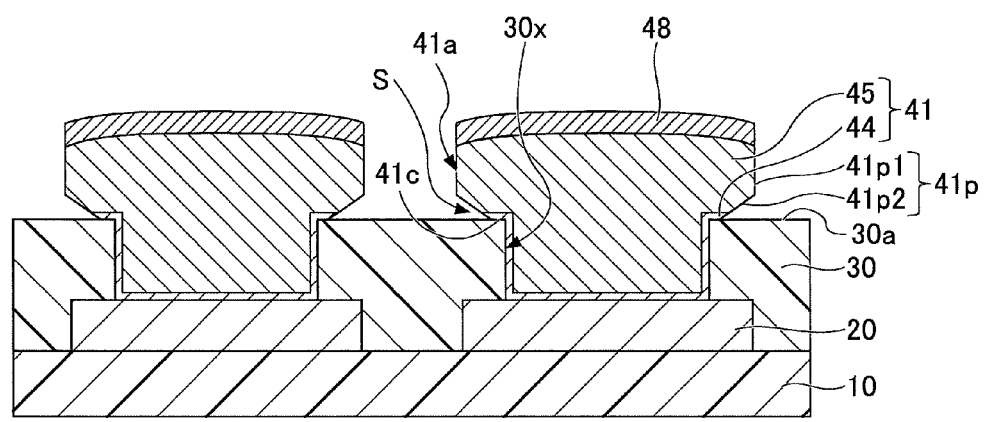
Figure 3H:
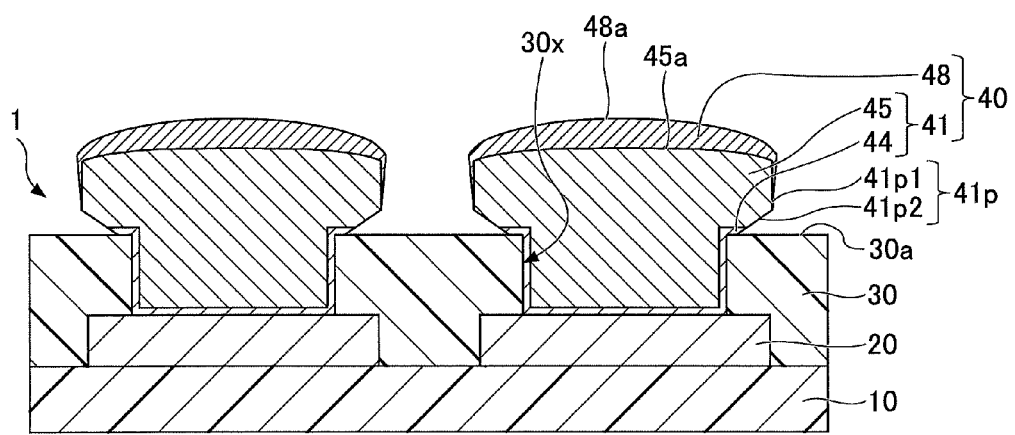

Next, in the process depicted in FIG. 3H, the surface metal layer 48 is heated by, for example, a reflow process to be melted, and is thereafter coagulated. The wet surface metal layer 48 spreads from the upper surface 45a onto a peripheral surface of the second metal layer 45 (the first peripheral surface 41p1 of the protruding metal layer 41). At this point, the wet surface metal layer 48 stops spreading, for example, at the lower edge of the first peripheral surface 41p1 because the second peripheral surface 41p2 is formed at an angle relative to the first peripheral surface 41p1. Therefore, the surface metal layer 48 is prevented from contacting the upper surface 30a of the solder resist layer 30. The surface metal layer 48, however, is not limited to the shape of FIG. 1B, and may have the shape illustrated in FIG. 2A or 2B as long as the surface metal layer 48 does not contact the upper surface 30a of the solder resist layer 30.

The thickness of part of the surface metal layer 48 on the upper surface 45a of the second metal layer 45 decreases from the center to the periphery because of surface tension during cooling after heating. The upper surface 48a of the surface metal layer 48 may be, for example, convexly curved. At this point, the curvature of the upper surface 48a of the surface metal layer 48 may be greater than the curvature of the upper surface 45a of the second metal layer 45. By the above-described process, the wiring substrate 1 depicted in, for example, FIGS. 1A and 1B is completed.

Figure 4A:
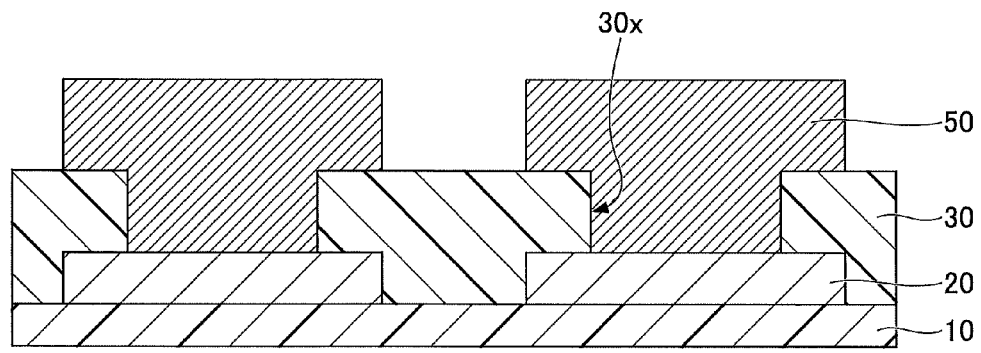
FIGS. 4A through 4C are cross-sectional views of a wiring substrate according to a comparative example.
Figure 4B:
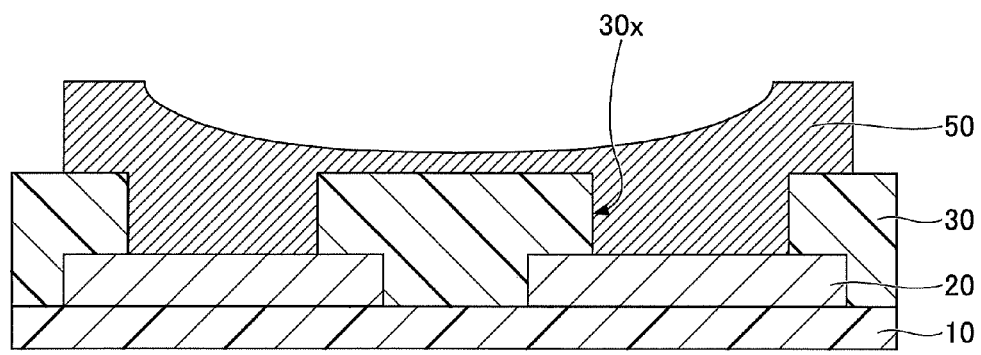
Figure 4C:
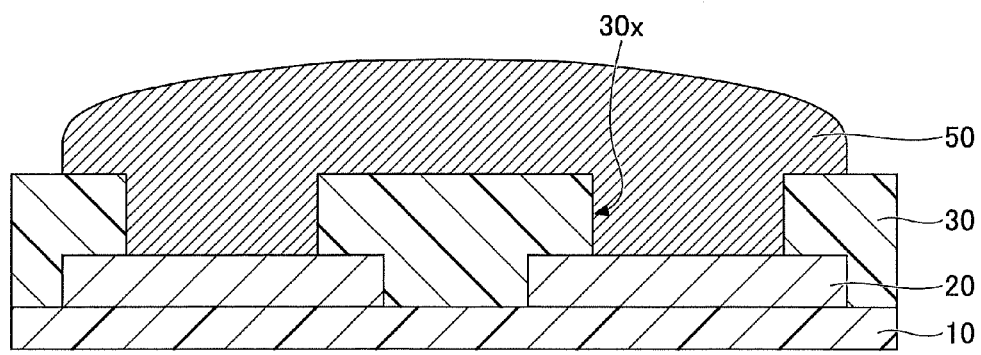

Next, effects produced by the wiring substrate 1 are described in contrast with a comparative example. FIGS. 4A through 4C are cross-sectional view of a wiring substrate according to a comparative example.

Referring to FIG. 4A, tin (Sn) bumps 50 are formed on the wiring layer 20 in the wiring substrate. FIG. 4A illustrates a state before a reflow process. Sn bumps easily change shape by contact. For example, when crushed as depicted in FIG. 4B, the adjacent bumps 50 connect to each other. When a reflow process is performed on the bumps 50 in the state of FIG. 4B, the bumps 50 are bridged because of surface tension as illustrated in FIG. 4C.

Figure 5A:
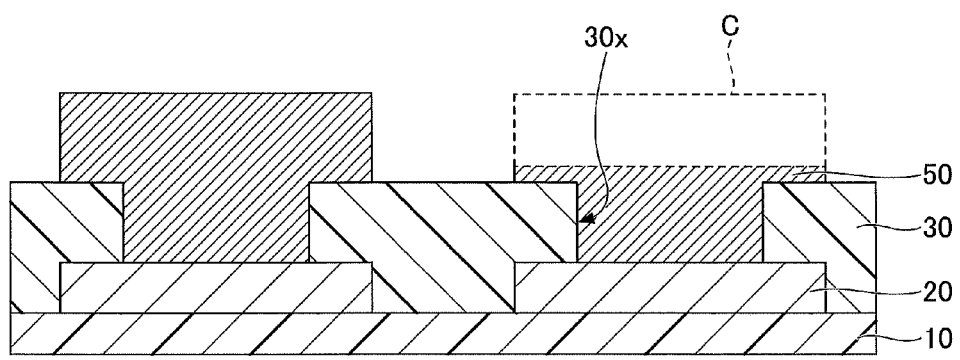
FIGS. 5A and 5B are cross-sectional views of the wiring substrate according to the comparative example.
Figure 5B:
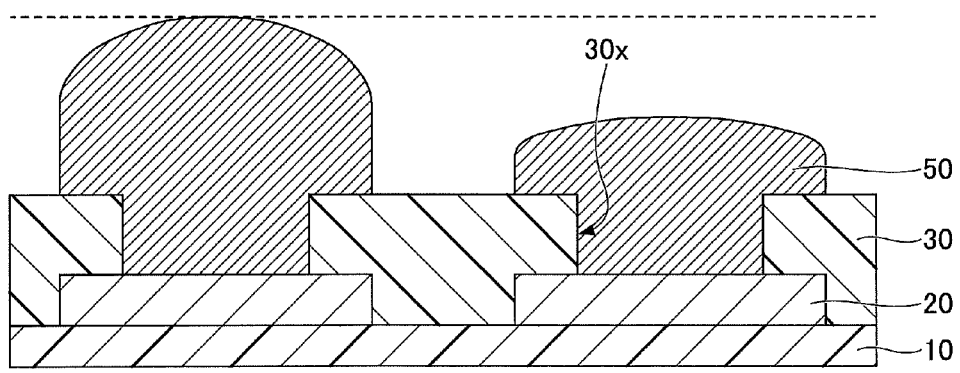

Furthermore, in the wiring substrate of the comparative example, when one of the bumps 50 is chipped to be reduced in volume before a reflow process as indicated by C in FIG. 5A, there is a difference in height between the bumps 50 after a reflow process as illustrated in FIG. 5B, and a connection failure may occur when mounting a component on the wiring substrate.

Figure 6A:
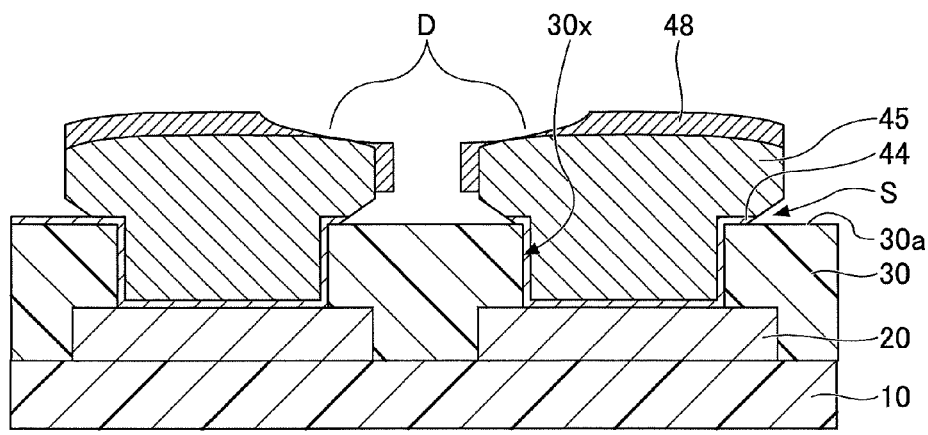
FIGS. 6A and 6B are diagrams for illustrating an effect according to the wiring substrate of the first embodiment.
Figure 6B:
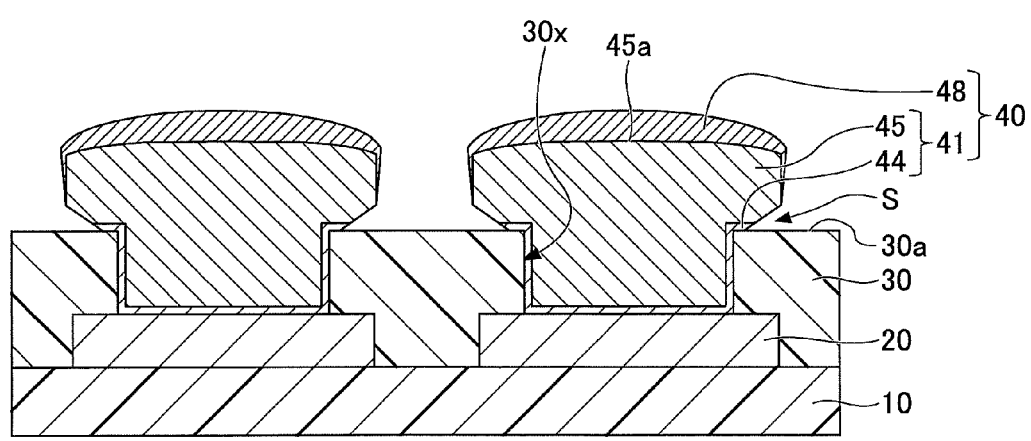

In contrast, according to the wiring substrate 1, even when structures to become the bumps 40 are crushed before a reflow process the same as in FIG. 4B to have dents D as illustrated in FIG. 6A, only the surface metal layer 48 deforms, and the relatively hard protruding metal layer 41 formed of copper (Cu) or the like does not deform. Therefore, the adjacent structures do not connect to each other. Furthermore, when a reflow process is performed in the state illustrated in FIG. 6A, the surface metal layer 48 becomes wet to spread over the upper surface 45a and the peripheral surface of the second metal layer 45 so that the dents D disappear as illustrated in FIG. 6B.

Figure 7A:
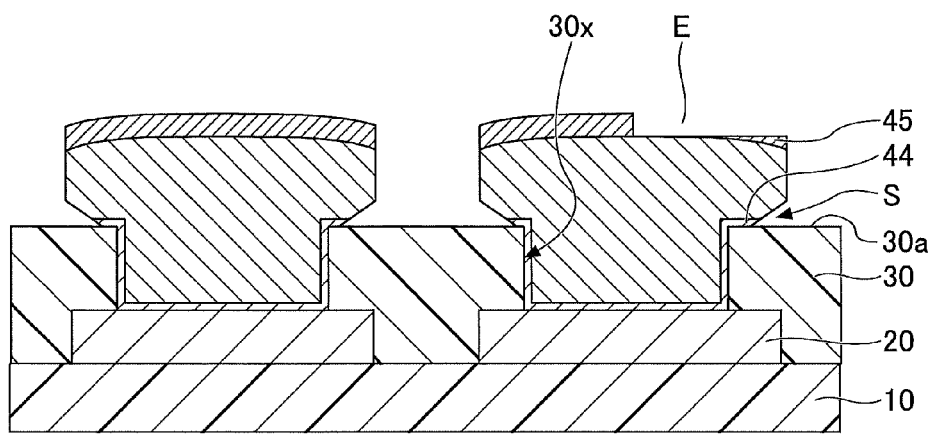
FIGS. 7A and 7B are diagrams for illustrating an effect according to the wiring substrate of the first embodiment.
Figure 7B:
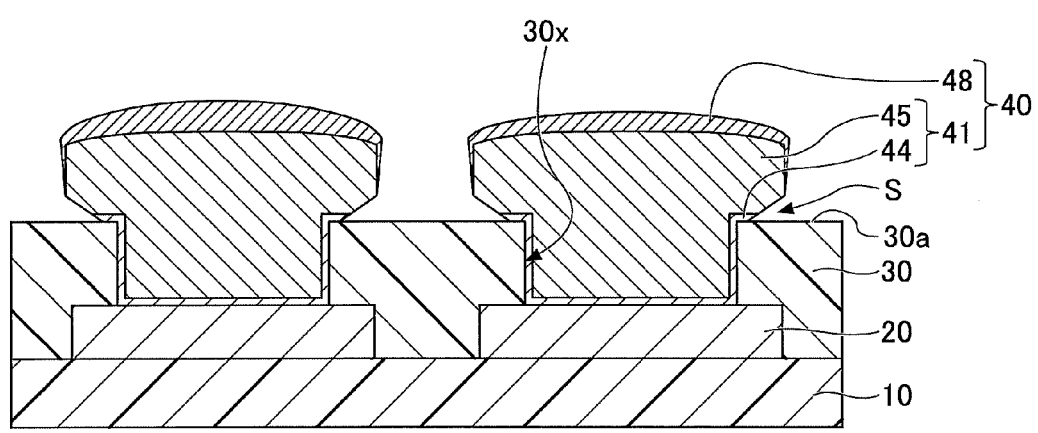

Furthermore, according to the wiring substrate 1, even when the surface metal layer 48 is chipped (as indicated by E in FIG. 7A) before a reflow process the same as in FIG. 5A, the relatively hard protruding metal layer 41 formed of copper (Cu) or the like is prevented from being chipped as illustrated in FIG. 7A. Therefore, there is no significant difference in volume between the bumps 40. Accordingly, the bumps 40 are less likely to differ in height after a reflow process as illustrated in FIG. 7B.

Furthermore, the residue of a catalyst (such as palladium (Pd)) used to form the first metal layer 44 serving as a seed layer may be present on the upper surface 30a of the solder resist layer 30. In this case, without the space S in the wiring substrate 1, the surface metal layer 48 would contact the solder resist layer 30. Therefore, when melting the surface metal layer 48, tin (Sn) or the like that forms the surface metal layer 48 might become wet to spread onto the upper surface 30a of the solder resist layer 30 to bridge and short-circuit the bumps 40. By providing the space S in the wiring substrate 1, the surface metal layer 48 is prevented from contacting the solder resist layer 30. Therefore, it is possible to prevent tin (Sn) or the like that forms the surface metal layer 48 from becoming wet to spread onto the upper surface 30a of the solder resist layer 30 to bridge and short-circuit the bumps 40 when melting the surface metal layer 48.

[Variation of First Embodiment]

A variation of the first embodiment is directed to another method of manufacturing the wiring substrate 1. In the following description, a description of the same elements or components as those of the above-described embodiment may be omitted.

FIGS. 8A through 8F are diagrams illustrating a process of manufacturing a wiring substrate according to the variation. First, in the process depicted in FIG. 8A, a photosensitive resist is formed on the first metal layer 44 and is thereafter exposed to light and developed to form the resist layer 300 including the opening 300x corresponding to the bump 40. According to this variation, however, unlike in the process of FIG. 3C, no skirt shape is formed at the bottom of the inner wall surface 300xa of the opening 300x as indicated by F in FIG. 8A. The photosensitive resist is exposed to ultraviolet radiation or the like with a normal amount of exposure. For example, when the photosensitive resist formed on the first metal layer 44 is 25 μm in thickness and the openings 300x are to be famed at intervals of 90 μm, exposure is normally performed with an output of approximately 150 mJ. As a result, no skirt shape is formed, and the opening 300x is formed with the substantially perpendicular inner wall surface 300xa.

Figure 8A:
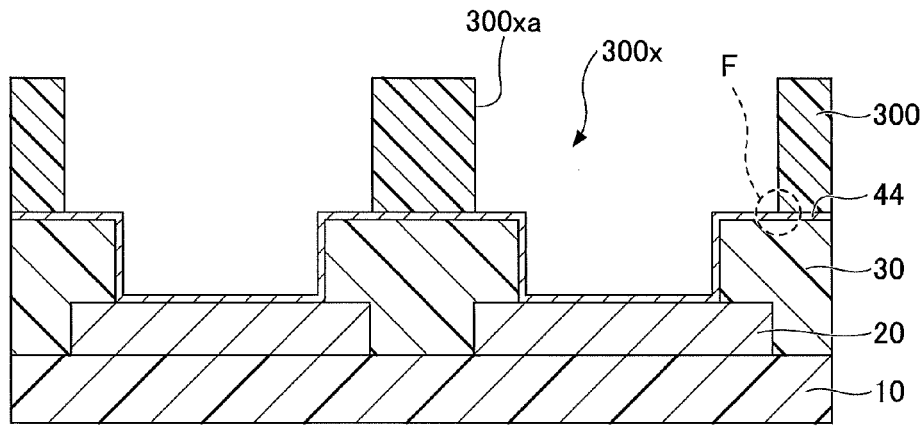
FIGS. 8A through 8F are diagrams illustrating a process of manufacturing a wiring substrate according to a variation of the first embodiment.
Figure 8B:
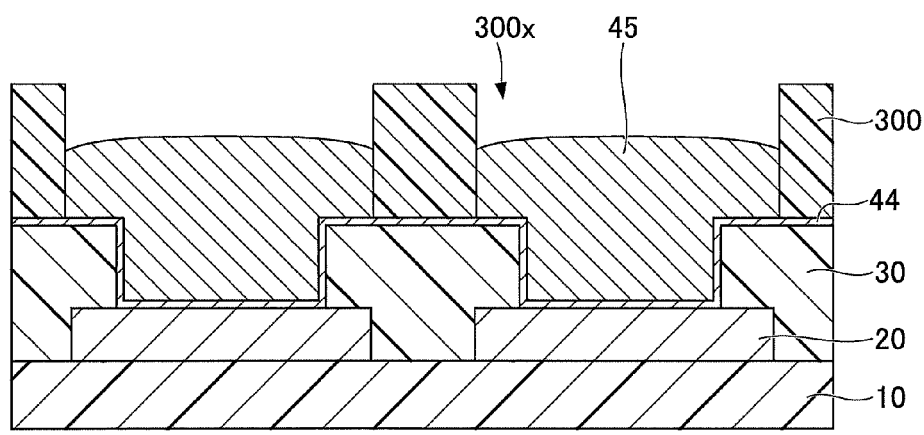
Figure 8C:
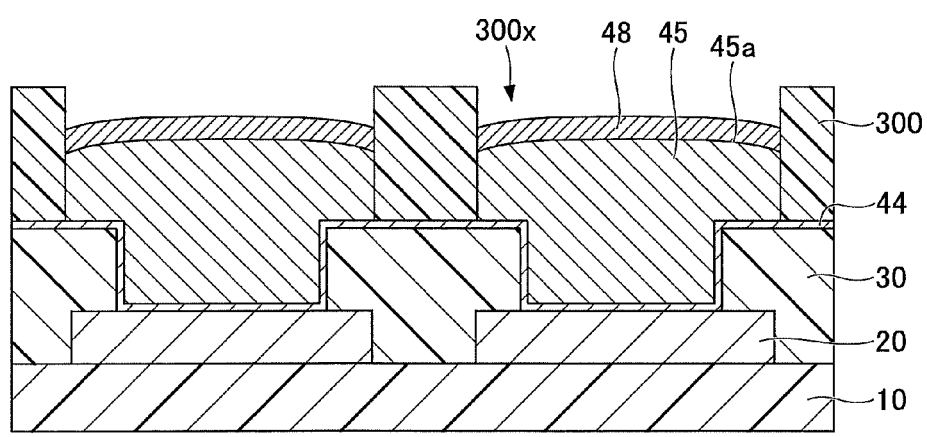

Next, in the process depicted in FIG. 8B, the second metal layer 45 is formed in the opening 300x of the resist layer 300 by electroplating, using the first metal layer 44 as a power feed layer, the same as in the process depicted in FIG. 3D. Then, in the process depicted in FIG. 8C, the surface metal layer 48 is formed on the upper surface 45a of the second metal layer 45 exposed in the opening 300x of the resist layer 300 by electroplating, using the first metal layer 44 as a power feed layer, the same as in the process depicted in FIG. 3E.

Figure 8D:
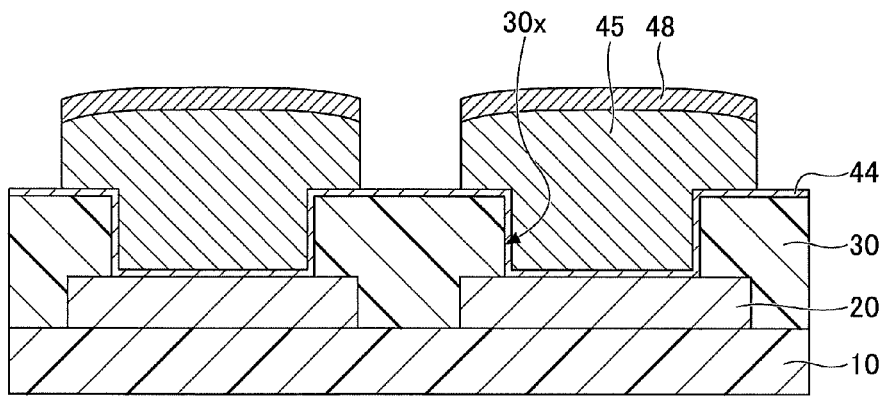

Next, in the process depicted in FIG. 8D, the resist layer 300 is removed using a stripping solution the same as in the process depicted in FIG. 3F. According to this embodiment, no skirt shape is formed at the bottom of the inner wall surface 300xa of the opening 300x in the process depicted in FIG. 8A. Therefore, at this point, the second peripheral surface 41p2 is not formed on the protruding metal layer 41, and the protruding metal layer 41 has a substantially perpendicular peripheral surface.

Figure 8E:
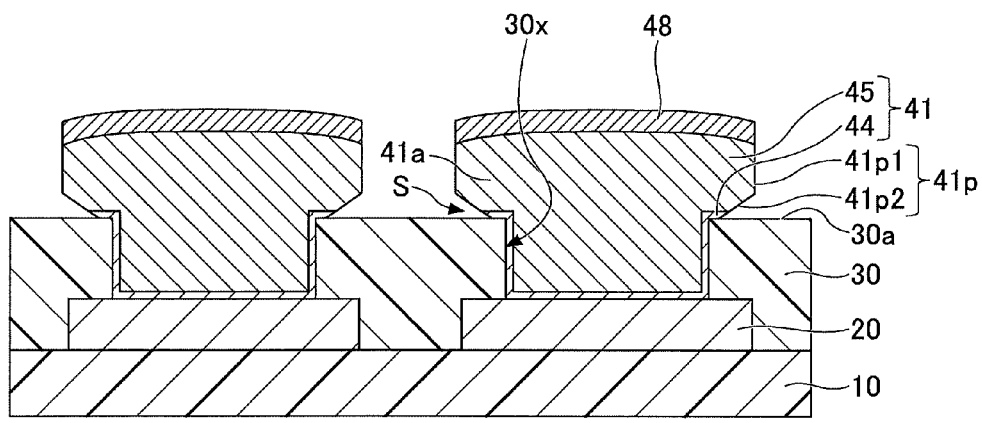

Next, in the process depicted in FIG. 8E, part of the first metal layer 44 not covered with the second metal layer 45 is removed by etching, using the second metal layer 45 and the surface metal layer 48 as a mask, the same as in the process depicted in FIG. 3G. At this point, a lower edge portion of part of the second metal layer 45 exposed over the upper surface 30a of the solder resist layer 30 and part of the first metal layer 44 between the lower edge portion of the second metal layer 45 and the upper surface 30a of the solder resist layer 30 are selectively etched. For example, by using an etchant containing an inhibitor that adsorbs to a part to which liquid is likely to flow, it is possible to selectively etch a part to which liquid is less likely to flow. That is, it is possible to selectively etch the lower edge portion of the second metal layer 45 above the solder resist layer 30 and the part of the first metal layer 44 between the lower edge portion of the second metal layer 45 and the upper surface 30a of the solder resist layer 30, to which liquid is less likely to flow. As a result, the second peripheral surface 41p2 is formed on the protruding metal layer 41 over the upper surface 30a of the solder resist layer 30. For example, a hydrogen peroxide/sulfuric acid etchant containing an organic additive may be used as an etchant containing an inhibitor.

Figure 8F:
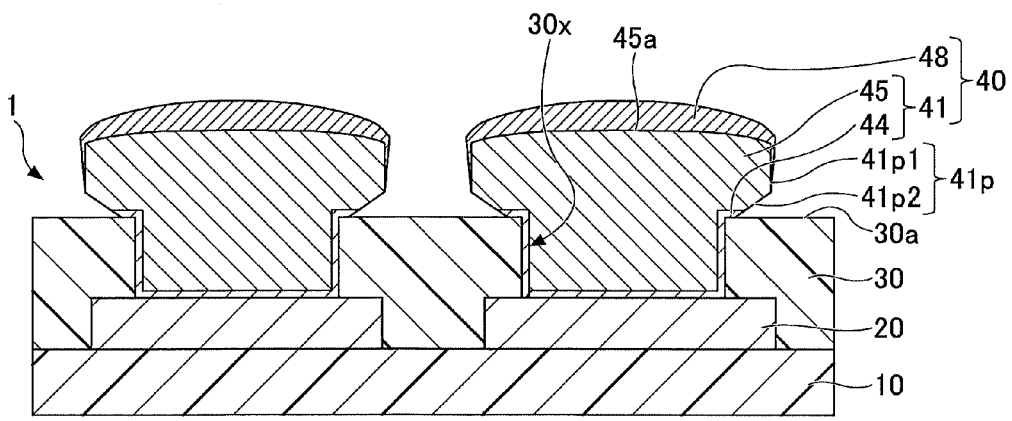

Next, in the process depicted in FIG. 8F, the surface metal layer 48 is heated by, for example, a reflow process to be melted, and is thereafter coagulated the same as in the process depicted in FIG. 3H. The wet surface metal layer 48 spreads from the upper surface 45a onto the peripheral surface of the second metal layer 45 (the first peripheral surface 41p1 of the protruding metal layer 41). By the above-described process, the wiring substrate 1 depicted in, for example, FIGS. 1A and 1B is completed.

As described above, the second peripheral surface 41p2 may be formed on the protruding metal layer 41 by etching.

According to the variation, the process depicted in FIG. 3C may be further employed. In this case, the space S formed in correspondence to the skirt shape in the opening 300x can be further expanded by etching in the process depicted in FIG. 8E. This is effective in the case where it is desired to increase the size of the space S.

Second Embodiment

According to a second embodiment, other metal layers are further provided on the wiring layer 20. In the following description, a description of the same elements or components as those of the above-described embodiment may be omitted.

Figure 9:
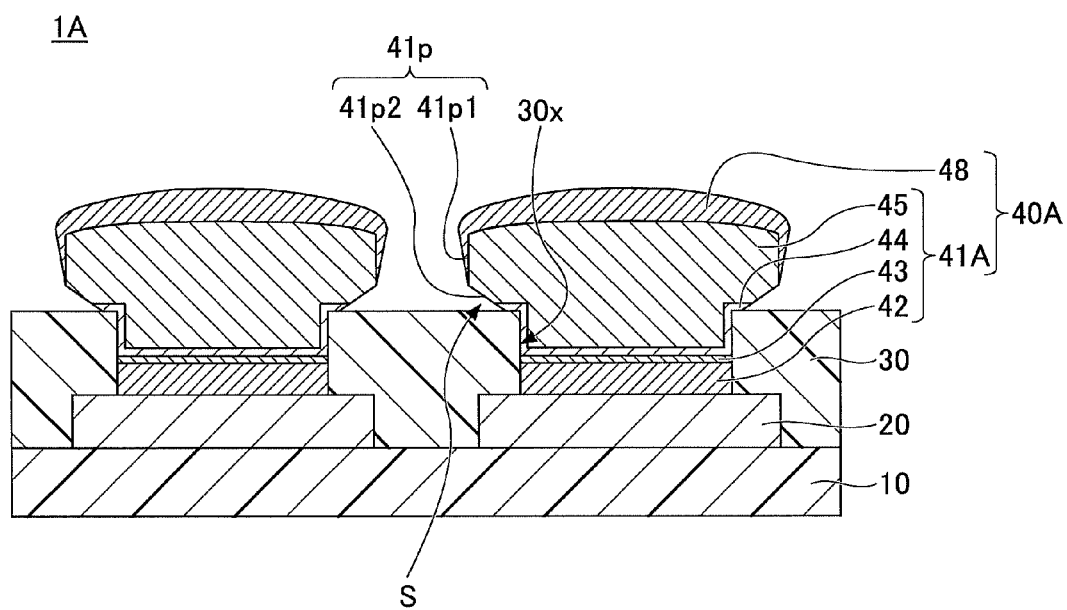
FIG. 9 is a cross-sectional view of a wiring substrate according to a second embodiment.

FIG. 9 is a cross-sectional view of a wiring substrate according to the second embodiment, illustrating part of the wiring substrate where wiring layers and insulating layers are alternately stacked.

Referring to FIG. 9, a wiring substrate 1A is different from the wiring substrate 1 of the first embodiment in that bumps 40A including a protruding metal layer 41A and the surface metal layer 48 are provided instead of the bumps 40. Hereinafter, the bumps 40A may be collectively referred to as "bump 40A" where a description is common to the bumps 40A. The protruding metal layer 41A has a structure where a third metal layer 42, a fourth metal layer 43, the first metal layer 44, and the second metal layer 45 are stacked in order. The third metal layer 42 may be formed of nickel (Ni). The fourth metal layer 43 may be formed of gold (Au). A metal layer formed of palladium (Pd) may be interposed between the third metal layer 42 and the fourth metal layer 43.

Figure 10A:
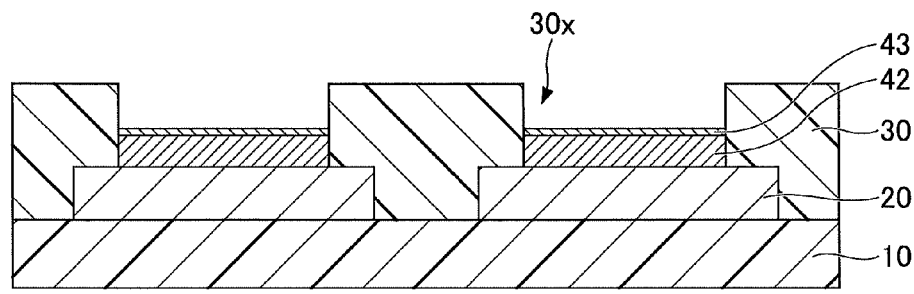
FIGS. 10A through 10C are diagrams illustrating a method of manufacturing a wiring substrate according to the second embodiment.
Figure 10B:
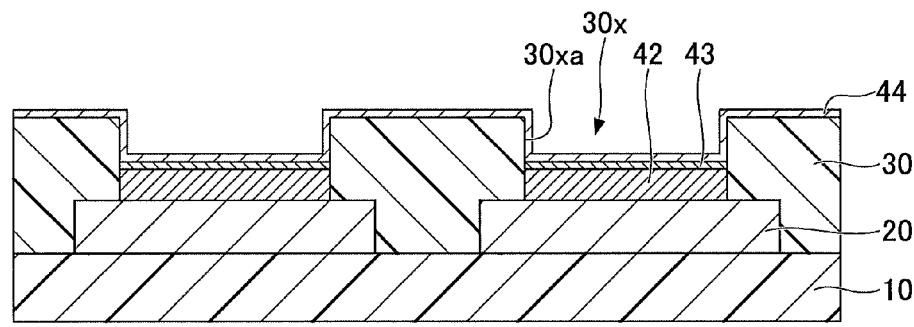
Figure 10C:
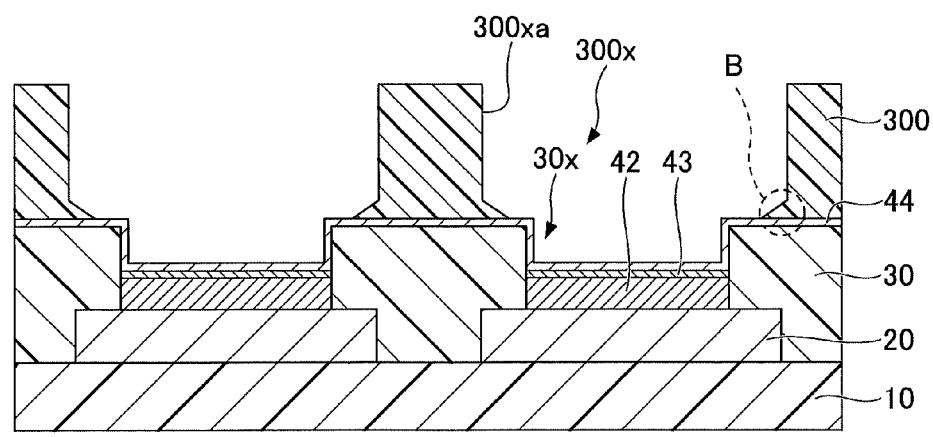

FIGS. 10A through 10C are diagrams illustrating a process of manufacturing a wiring substrate according to the second embodiment. First, after execution of the process depicted in FIG. 3A, in the process depicted in FIG. 10A, the third metal layer 42 and the fourth metal layer 43 are formed in order on the wiring layer 20. The third metal layer 42 and the fourth metal layer 43 may be formed by, for example, electroless plating.

Next, in the process depicted in FIG. 10B, the first metal layer 44 is formed to continuously cover the upper surface 30a of the solder resist layer 30, the inner wall surface 30xa of the opening 30x, and the upper surface of the fourth metal layer 43 exposed in the opening 30x the same as in the process depicted in FIG. 3B.

Next, in the process depicted in FIG. 10C, a negative photosensitive resist (such as a dry film resist) is formed on the first metal layer 44, and thereafter, the photosensitive resist is exposed to light and developed to form the resist layer 300 that includes the opening 300x corresponding to the bump 40A the same as in the process depicted in FIG. 3C. According to this embodiment, the skirt shape is formed at the bottom of the inner wall surface 300xa of the opening 300x.

Thereafter, the same processes as depicted in FIGS. 3D through 3H are executed to complete the wiring substrate 1A depicted in FIG. 9.

Instead of being formed in the above-described manner, the second peripheral surface 41p2 may be formed on the protruding metal layer 41 in the manner as described in the variation of the first embodiment.

According to the wiring substrate 1A, when the third metal layer 42 is faulted of nickel (Ni), the peripheral surface of the third metal layer 42 does not adhere to the inner wall surface 30xa of the opening 30x. This is because nickel (Ni), which deposits on a metal with palladium (Pd) added onto the metal, does not deposit on the inner wall surface 30xa of the opening 30x of the solder resist layer 30, which is resin. That is, the peripheral surface of the third metal layer 42 formed of nickel (Ni) is in contact with, but is not adhering to, the inner wall surface 30xa of the opening 30x.

Thus, by providing the third metal layer 42 formed of nickel (Ni) on the wiring layer 20, a layer that does not adhere to the inner wall surface 30xa of the opening 30x of the solder resist layer 30 can be formed. Therefore, it is possible to reduce stress generated between the bump 40A and the wiring layer 20 (stress in the thickness direction of the wiring substrate 1A).

Furthermore, by forming a gold (Au) layer or the like as the fourth metal layer 43, the fourth metal layer 43 serves as a barrier layer to prevent the third metal layer 42 such as a nickel (Ni) layer from being corroded in the process of forming the first metal layer 44 and the second metal layer 45. That is, to form the second metal layer 45, the first metal layer 44 of copper (Cu) or the like is formed as a seed layer by electroless plating. If a nickel (Ni) underlayer is exposed in the process of electroless plating, however, nickel (Ni) is corroded to reduce the interface strength. Specifically, nickel (Ni) dissolves, for example, in the process of removing an unnecessary part of the first metal layer 44 by etching. A gold (Au) layer, which is inert, for example, in the process of removing an unnecessary part of the first metal layer 44 by etching, serves as a barrier layer to prevent corrosion of the nickel (Ni) layer or the like.

Electroless gold plating is poor in film quality. Therefore, a thin gold (Au) layer does not serve as a barrier layer, and the gold (Au) layer is desired to be thick. Gold (Au), however, is very expensive. Therefore, in terms of cost reduction, it is preferable to provide a metal layer formed of palladium (Pd) between the third metal layer 42 and the fourth metal layer 43 to form a barrier layer having a two-layer structure of a palladium (Pd) layer and a gold (Au) layer.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing a wiring substrate, comprising:
    forming an insulating layer that covers a wiring layer, and forming a first opening in a surface of the insulating layer, the first opening exposing the wiring layer;
    forming a resist layer on the insulating layer, the resist layer including a second opening that exposes the first opening and a periphery of the first opening;
    forming a protruding metal layer on the wiring layer exposed in the second opening, the protruding metal layer being connected to the wiring layer and protruding from the surface of the insulating layer to extend outward onto the surface of the insulating layer around the first opening;
    forming a surface metal layer that covers a first surface of the protruding metal layer exposed in the second opening;
    removing the resist layer; and
    melting and coagulating the surface metal layer, melting and coagulating the surface metal layer including causing the surface metal layer to become wet to spread from the first surface of the protruding metal layer to a peripheral surface of the protruding metal layer without contacting the surface of the insulating layer, the peripheral surface of the protruding metal layer extending between the first surface and a second surface of the protruding metal layer opposite from the first surface and contacting the surface of the insulating layer, the peripheral surface being bent inward to form a space between the peripheral surface and the surface of the insulating layer, the surface metal layer being formed of a metal having a lower melting point than the protruding metal layer.

2. The method of clause 1, wherein forming the resist layer forms a skirt shape corresponding to the space at a bottom of an inner wall surface of the second opening.

3. The method of clause 1, wherein a part of the protruding metal layer facing the insulating layer is etched to form the space before removing the resist layer.

4. The method of clause 1, wherein a height of the space from the surface of the insulating layer increases in an outward direction away from the opening.

What is claimed is:

1. A wiring substrate, comprising:
    a wiring layer;
    an insulating layer covering the wiring layer, and including an opening formed in a surface of the insulating layer to expose the wiring layer; and
    a protruding electrode provided in the opening to protrude from the surface of the insulating layer,
    the protruding electrode including
        a protruding metal layer connected to the wiring layer in the opening, and extending from within the opening to be stepped at an edge of the opening to extend outward onto the surface of the insulating layer, the protruding metal layer including a first surface contacting the surface of the insulating layer around the opening, a second surface opposite from the first surface, and a peripheral surface extending between the first surface and the second surface, and bent inward to form a space between the peripheral surface and the surface of the insulating layer; and
        a surface metal layer covering the protruding metal layer without contacting the surface of the insulating layer, the surface metal layer being formed of a metal having a lower melting point than the protruding metal layer.

2. The wiring substrate as claimed in claim 1, wherein the peripheral surface includes
    a first peripheral surface extending from the second surface substantially perpendicularly to the surface of the insulating layer; and
    a second peripheral surface extending from the first peripheral surface to the first surface at an angle to the first peripheral surface, and
    the surface metal layer covers the second surface and the peripheral surface of the protruding metal layer except for the second peripheral surface.

3. The wiring substrate as claimed in claim 1, wherein the second surface of the protruding metal layer is convexly curved.

4. The wiring substrate as claimed in claim 1, wherein the protruding metal layer includes
    a first metal layer covering the surface of the insulating layer around the opening, an inner wall surface of the opening, and a surface of the wiring layer exposed in the opening; and
    a second metal layer formed on the first metal layer to protrude from the surface of the insulating layer, and
    a maximum height of the space from the surface of the insulating layer is greater than a thickness of the first metal layer.

5. The wiring substrate as claimed in claim 4, wherein the protruding metal layer further comprises a nickel layer between the wiring layer and the first metal layer.

6. The wiring substrate as claimed in claim 5, wherein the protruding metal layer further comprises a barrier layer between the nickel layer and the first metal layer, the barrier layer preventing corrosion of the nickel layer.

7. The wiring substrate as claimed in claim 1, wherein a height of the space from the surface of the insulating layer increases in an outward direction away from the opening.

8. A wiring substrate, comprising:
a wiring layer;
an insulating layer covering the wiring layer; and
a protruding electrode protruding from a surface of the insulating layer,
the protruding electrode including
   a buried part buried in the insulating layer;
   an exposed part extending from the buried part to be exposed on the surface of the insulating layer; and
   a metal layer formed of a metal having a lower melting point than the buried part and the exposed part, and covering a surface of the exposed part without contacting the insulating layer,
wherein the exposed part includes
   a first portion including the surface covered by the metal layer; and
   a second portion extending between the buried part and the first portion, the second portion expanding outward toward the first portion to have a peripheral surface inclined relative to the surface of the insulating layer.

\* \* \* \* \*